(12) United States Patent
McDonald et al.

(10) Patent No.: US 6,683,370 B1
(45) Date of Patent: Jan. 27, 2004

(54) SEMICONDUCTOR COMPONENT AND METHOD OF MANUFACTURING SAME

(75) Inventors: William G. McDonald, Scottsdale, AZ (US); Michael Chapman, Gilbert, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/417,992

(22) Filed: Apr. 15, 2003

(51) Int. Cl.[7] .................... H01L 23/495; H01L 23/12
(52) U.S. Cl. ............. 257/676; 257/672; 257/684; 257/704
(58) Field of Search ........................ 257/676, 666, 257/672, 684, 704

(56) References Cited

U.S. PATENT DOCUMENTS

| | | | |
|---|---|---|---|
| 5,309,460 A | * | 5/1994 | Fujimaki et al. ............ 257/787 |
| 5,355,016 A | * | 10/1994 | Swirbel et al. ............ 257/659 |
| 5,489,800 A | * | 2/1996 | Brown et al. ............... 257/666 |
| 5,874,784 A | * | 2/1999 | Aoki et al. ................. 257/787 |
| 5,918,112 A | | 6/1999 | Shah et al. |
| 6,166,430 A | * | 12/2000 | Yamaguchi ................. 257/666 |
| 6,177,723 B1 | * | 1/2001 | Eng et al. ................... 257/691 |
| 6,424,024 B1 | * | 7/2002 | Shih et al. .................. 257/667 |
| 6,444,563 B1 | | 9/2002 | Potter et al. |
| 6,476,486 B1 | * | 11/2002 | Humphrey et al. ......... 257/738 |
| 6,498,392 B2 | * | 12/2002 | Azuma ....................... 257/676 |
| 6,583,499 B2 | * | 6/2003 | Huang et al. ............... 257/666 |
| 2001/0007780 A1 | * | 7/2001 | Minamio et al. .......... 438/106 |
| 2002/0024127 A1 | * | 2/2002 | Sakuraba et al. .......... 257/686 |
| 2002/0185713 A1 | * | 12/2002 | Nakae ......................... 257/666 |
| 2003/0178711 A1 | * | 9/2003 | Honda et al. ............... 257/676 |

FOREIGN PATENT DOCUMENTS

JP          62-22468       * 1/1987 ................. 257/666

* cited by examiner

Primary Examiner—Jasmine Clark
(74) Attorney, Agent, or Firm—Bryan Cave LLP

(57) ABSTRACT

A semiconductor component includes a non-leaded leadframe (100, 200, 300) having at least one interior electrical contact (110) and a plurality of exterior electrical contacts (120), a semiconductor chip (410) mounted onto the leadframe, a mold compound (510) disposed around the semiconductor chip, a cavity (520) in the mold compound exposing a portion of the at least one interior electrical contact, an electronic chip (710) mounted in the cavity, and a cover (810) disposed over the cavity. In one embodiment, the leadframe is part of an array including a plurality of leadframes spaced apart from each other by a plurality of dam bars.

29 Claims, 4 Drawing Sheets

SEMICONDUCTOR COMPONENT AND METHOD OF MANUFACTURING SAME

FIELD OF THE INVENTION

This invention relates generally to semiconductor components, and relates more particularly to semiconductor components having a plurality of electronic chips.

BACKGROUND OF THE INVENTION

With the increased market demand for smaller semiconductor components and with the growth of the sensor market, there is a need for packaged sensor chips having increased accuracy and functionality. Accordingly, integrated circuits and sensors have been combined onto a single printed circuit board (PCB). However, in certain applications it is desirable to have the sensor chip separate from the integrated circuit chip for reasons of functionality, reliability, safety, and/or manufacturability. Communication between the integrated circuit and the sensor, and between the integrated circuit and other components of the package, has traditionally been provided via electrically-conducting traces placed on the PCB. This method consumes significant area on the PCB, and requires numerous solder connections for each component. Accordingly, a need exists for a multi-chip semiconductor component assembled in a single, discrete, leadless package platform, having increased sensor functionality and accuracy as well as decreased component handling, PCB size, and solder connection requirements.

BRIEF DESCRIPTION OF THE DRAWINGS

The invention will be better understood from a reading of the following detailed description, taken in conjunction with the accompanying figures in the drawings in which.

Figure 2:
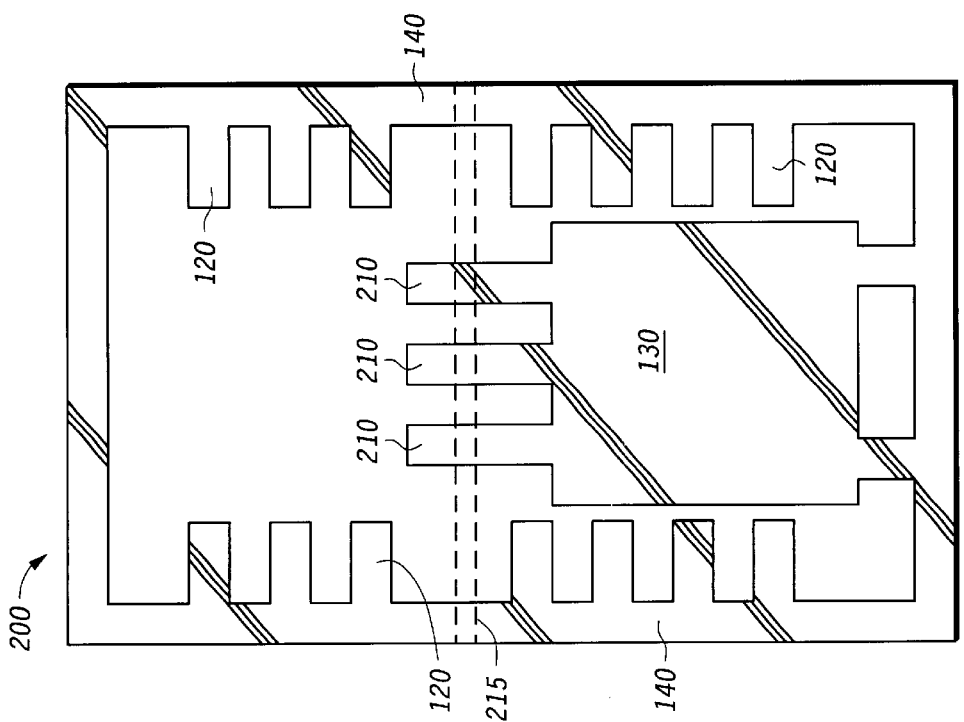
FIG. 2 is a top view of another leadframe for use with a semiconductor component according to an embodiment of the invention.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner.

DETAILED DESCRIPTION OF THE DRAWINGS

In one embodiment of the invention, a semiconductor component comprises: a non-leaded leadframe having at least one interior electrical contact and a plurality of exterior electrical contacts; a semiconductor chip mounted onto the leadframe; a mold compound disposed around the semiconductor chip; a cavity in the mold compound exposing a portion of the at least one interior electrical contact; an electronic chip mounted in the cavity; at least one electrical connection between the semiconductor chip and the electronic chip, and a cover disposed over the cavity.

Figure 1:
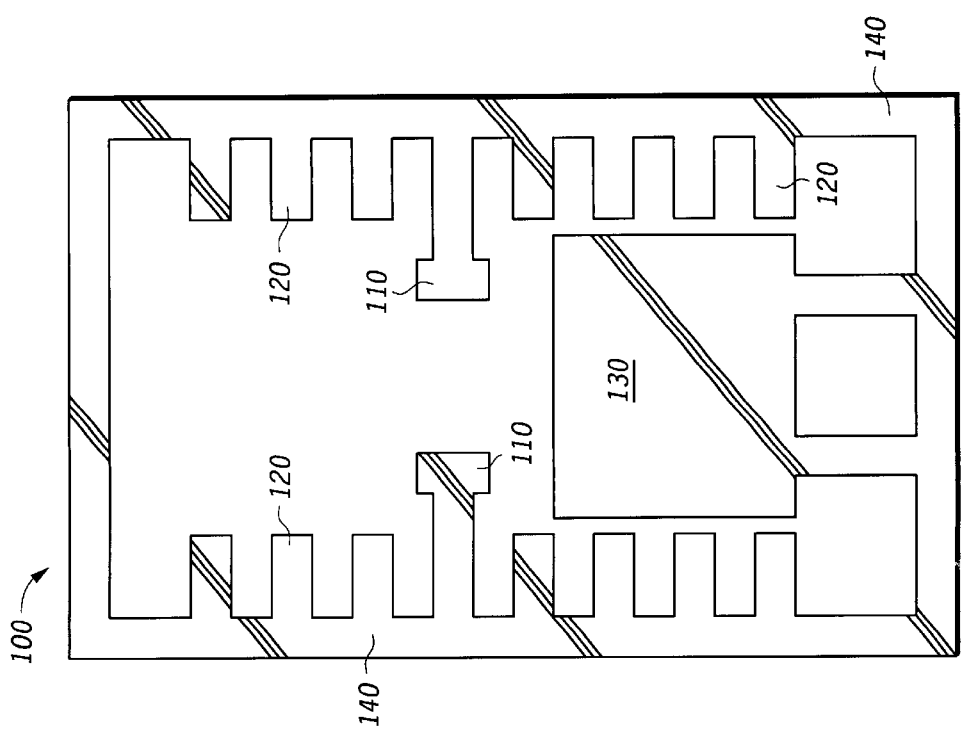
FIG. 1 is a top view of a leadframe for use with a semiconductor component according to an embodiment of the invention.

Refer now to FIG. 1, which is a top view of a non-leaded leadframe 100 for use with a semiconductor component according to an embodiment of the invention. As an example, non-leaded leadframe 100 can be comprised of copper or a copper alloy. As another example, non-leaded leadframe 100 can be comprised of a substrate with conductive tracings or with flex circuitry. As yet another example, non-leaded leadframe 100 can be a quad flat non-leaded (QFN) leadframe, comprised of the above-mentioned or other materials. Non-leaded leadframe 100 comprises interior portions, tabs, posts, or electrical contacts 110 and a plurality of exterior electrical contacts 120. In the illustrated embodiment, non-leaded leadframe 100 further comprises a flag 130 for supporting, for example, an electronic chip. In an alternate, non-illustrated embodiment, non-leaded leadframe 100 does not have flag 130.

Interior electrical contacts 110, exterior electrical contacts 120, and flag 130 are all attached to a dam bar 140, which is removed prior to the electrical testing of the semiconductor component. When dam bar 140 is removed from non-leaded leadframe 100, exterior electrical contacts 120 are physically separated, and often electrically isolated, from each other, and from interior electrical contacts 110. Interior electrical contacts 110 are also physically separated, and often electrically isolated, from each other after removal of dam bar 140. In one embodiment, interior electrical contacts 110 and, in the same or another embodiment, exterior electrical contacts 120, may comprise a notch or half etch feature (not shown) for mold locking purposes and/or purposes related to the removal of dam bar 140, as will be more fully discussed below in connection with FIG. 9.

FIG. 2 is a top view of a non-leaded leadframe 200 for use with a semiconductor component according to an embodiment of the invention. As an example, non-leaded leadframe 200 can be similar to non-leaded leadframe 100 in FIG. 1, except that non-leaded leadframe 200 comprises interior electrical contacts 210, whose configuration differs from the configuration of interior electrical contacts 110 of non-leaded leadframe 100 in FIG. 1. Interior electrical contacts 210 are initially electrically shorted together, as shown, to provide physical attachment to non-leaded leadframe 200 before the disposition of a mold compound around non-leaded leadframe 200. After the disposition of the mold compound, interior electrical contacts 210 must be electrically isolated from each other. This electrical isolation may be accomplished by making a cut along a channel 215. As an example, the cut along channel 215 can be made from the side of non-leaded leadframe 200 opposite to the side illustrated in FIG. 2.

Figure 3:
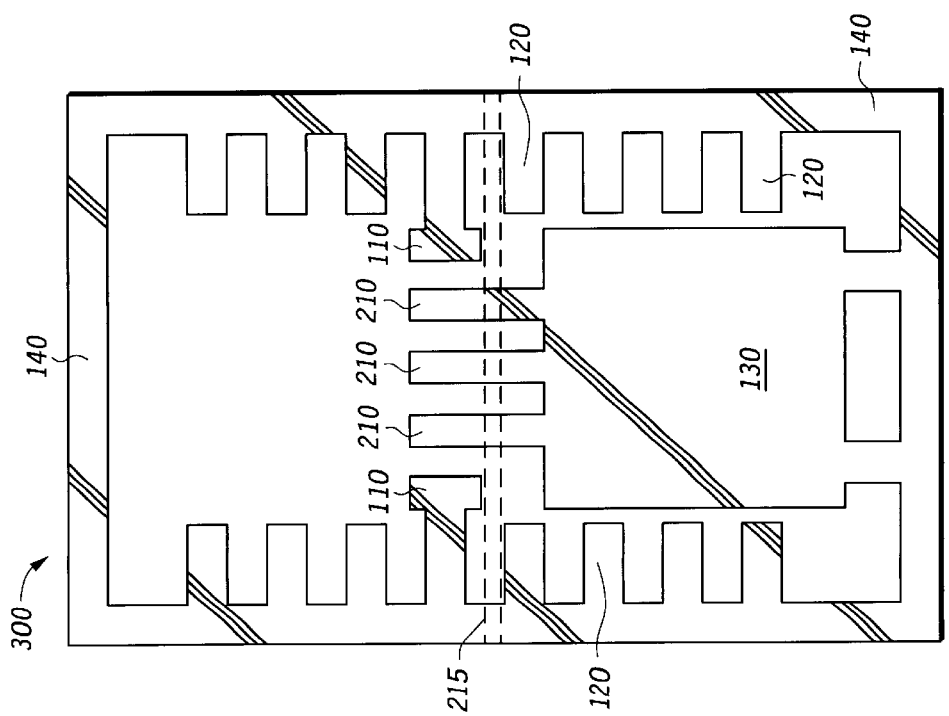
FIG. 3 is a top view of still another leadframe for use with a semiconductor component according to an embodiment of the invention.

FIG. 3 is a top view of a non-leaded leadframe 300 for use with a semiconductor component according to an embodiment of the invention. As an example, non-leaded leadframe 300 can be a combination of non-leaded leadframes 100 and 200 in FIGS. 1 and 2, respectively, in that non-leaded leadframe 300 comprises both interior electrical contacts 110 and interior electrical contacts 210.

In one embodiment, non-leaded leadframes 100, 200, and/or 300 can form part of an array (not shown) in which a plurality of non-leaded leadframes are spaced apart from each other by a plurality of tie bars (not shown) and/or dam bars, such as dam bar 140. In that embodiment, after a molding step, individual non-leaded leadframes can be singulated from other individual non-leaded leadframes by, for example, sawing the array across the plurality of tie bars and/or dam bars.

The following figures and accompanying text show and describe a semiconductor component comprising a non-leaded leadframe similar to non-leaded leadframe 100 in FIG. 1. It will be understood by one of ordinary skill in the art that the semiconductor component could also comprise a non-leaded leadframe similar to non-leaded leadframe 200 in FIG. 2, non-leaded leadframe 300 in FIG. 3, or a non-leaded leadframe in any of a wide variety of other non-illustrated configurations.

Figure 4:
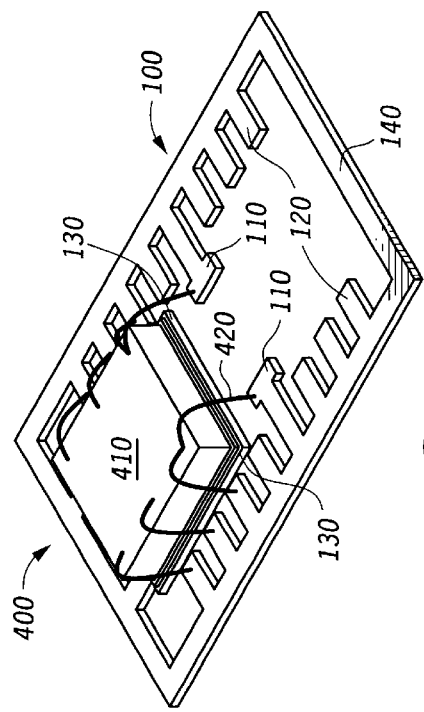
FIG. 4 is a top isometric view of a semiconductor component at one stage of a manufacturing process according to an embodiment of the invention.

FIG. 4 is a top isometric view of a semiconductor component 400 at one stage of a manufacturing process according to an embodiment of the invention. Semiconductor component 400 comprises a semiconductor chip 410 disposed over, disposed adjacent to, aligned to, or mounted on flag 130. As an example, semiconductor chip 410 can be a discrete device, an integrated circuit, or a control chip. Semiconductor chip 410 is electrically coupled to interior electrical contacts 110 and exterior electrical contacts 120. In the illustrated embodiment, the electrical coupling is accomplished via wire bonds 420. However, tape-automated-bonding (TAB) or flip-chip bonding techniques could also be used to provide the electrical coupling. In the case of flip-chip bonding, the step of mounting semiconductor chip 410 over non-leaded leadframe 100 inherently includes the electrical coupling step.

Figure 5:
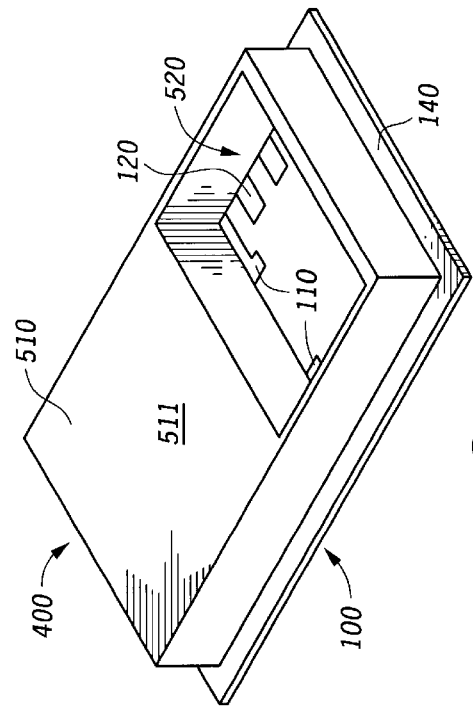
FIG. 5 is a top isometric view of the semiconductor component of FIG. 4 at another stage of the manufacturing process according to an embodiment of the invention.

FIG. 5 is a top isometric view of semiconductor component 400 at another stage of the manufacturing process according to an embodiment of the invention. As shown in FIG. 5, semiconductor component 400 comprises a mold compound 510 disposed around semiconductor chip 410 (FIG. 4). Mold compound 510 comprises an upper surface 511, a lower surface 610 (see FIG. 6), and a cavity 520. Cavity 520 exposes a portion of at least one of interior electrical contacts 110. Cavity 520 can also expose portions of exterior electrical contacts 120.

Figure 6:
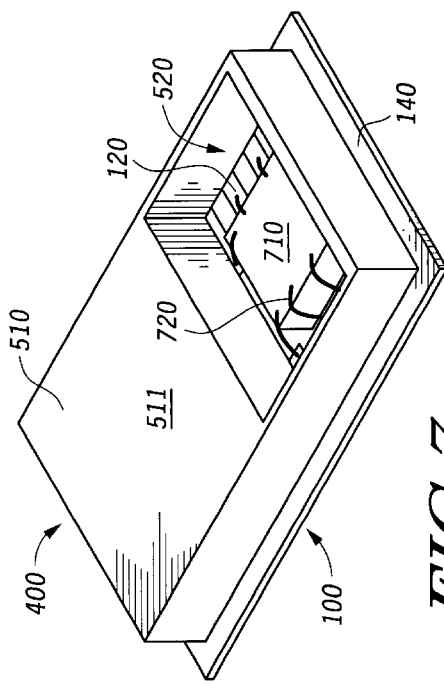
FIG. 6 is a bottom isometric view of the semiconductor component of FIG. 5 according to an embodiment of the invention.

FIG. 6 is a bottom isometric view of semiconductor component 400 according to an embodiment of the invention. FIG. 6 depicts bottom surfaces of non-leaded leadframe 100, interior electrical contacts 110, exterior electrical contacts 120, flag 130, and dam bar 140. Also illustrated in FIG. 6 is lower surface 610 of mold compound 510. Exterior electrical contacts 120 extend through lower surface 610 of mold compound 510 so as to be available to make electrical contact with a printed circuit board using a surface mount technique. In one embodiment, lower surface 610 of mold compound 510 may be provided with a vent 620 and/or an additional flag to provide, respectively, ambient exposure and/or an additional chip-mounting location. In a particular embodiment, vent 620 is located in lower surface 610 of mold compound 510 underneath cavity 520 (FIG. 5), so as to provide ambient exposure for electronic chip 710 (FIG. 7) in cavity 520.

Figure 7:
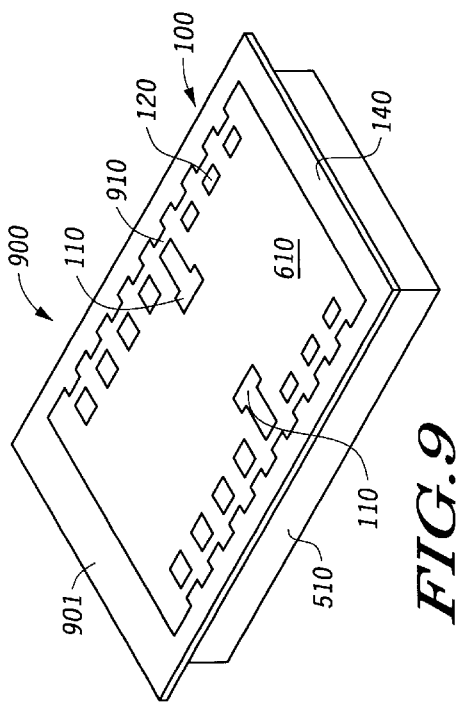
FIG. 7 is a top isometric view of the semiconductor component of FIG. 5 at another stage of the manufacturing process according to an embodiment of the invention.

FIG. 7 is a top isometric view of semiconductor component 400 at another stage of the manufacturing process according to an embodiment of the invention. FIG. 7 illustrates an electronic chip 710 mounted or otherwise disposed in cavity 520. As an example, electronic chip 710 can be a sensor that is to be exposed to the environment. As a particular example, electronic chip 710 can be a chemical sensor, a pressure sensor, a temperature sensor, an optical sensor, a velocity sensor, or an accelerometer. Alternatively, electronic chip 710 could be a surface acoustic wave (SAW) device, or another semiconductor chip.

After electronic chip 710 is mounted in cavity 520, it is electrically coupled to interior electrical contacts 110 and exterior electrical contacts 120 of non-leaded leadframe 100. As an example, the electrical coupling can be accomplished via wire bonds 720. In one embodiment, wire bonds 720 can be similar to wire bonds 420 in FIG. 4. TAB or flip-chip bonding techniques could also be used to provide the electrical coupling between electronic chip 710 and interior electrical contacts 110 and exterior electrical contacts 120. In the case of flip-chip bonding, the step of mounting electronic chip 710 in cavity 520 inherently includes the electrical coupling step. Electrically coupling electronic chip 710 to interior electrical contacts 110 also electrically couples electronic chip 710 to semiconductor chip 410, because, as explained above, semiconductor chip 410 is also electrically coupled to interior electrical contacts 110. Electronic chip 710 can also be directly or indirectly electrically coupled to exterior electrical contacts 120.

In a non-illustrated embodiment, semiconductor component 400 can comprise one or more electronic chips, in addition to electronic chip 710, and/or one or more passive components mounted in cavity 520 or elsewhere over non-leaded leadframe 100. The one or more additional electronic chips can be electrically coupled to exterior electrical contacts 120 and/or semiconductor chip 410 via interior electrical contracts 110. As an example, the electrical coupling may be accomplished via wire bonds that may be similar to wire bonds 420 in FIG. 4 and 720 in FIG. 7. TAB or flip-chip bonding techniques may also be used. Mold compound 510 or another compound may be disposed over the one or more additional electronic chips. As an example, the passive components can include capacitors, resistors, and the like. As a further example, the one or more additional electronic chips can be chemical sensors, pressure sensors, temperature sensors, optical sensors, velocity sensors, accelerometers, SAW devices, or radio frequency (RF) switches.

As will be described in connection with FIG. 8, semiconductor component 400 can further comprise a cover disposed over cavity 520. However, for certain types of electronic chips, such as, for example, optical sensors, a greater degree of exposure to ambient conditions than is possible in the presence of such a cover is needed. Accordingly, one embodiment of semiconductor chip 400 resembles the illustration in FIG. 7, where cavity 520 and its contents are not covered, but are exposed to ambient conditions.

Figure 8:
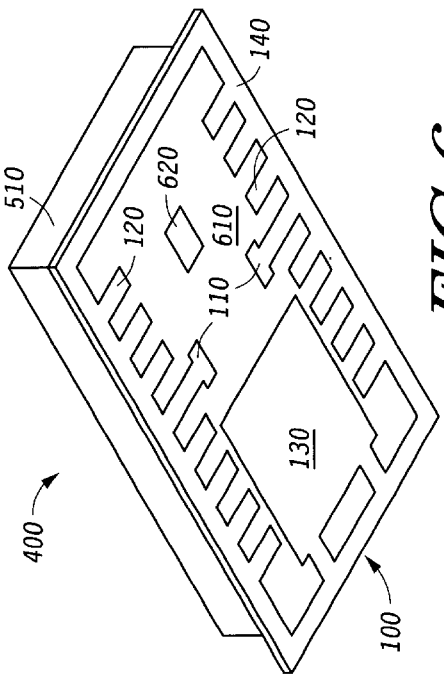
FIG. 8 is a top isometric view of the semiconductor component of FIG. 7 at another stage of the manufacturing process according to an embodiment of the invention.

FIG. 8 is a top isometric view of semiconductor component 400 at another stage of the manufacturing process according to an embodiment of the invention. FIG. 8 depicts a cover 810 disposed over electronic chip 710 (FIG. 7) and cavity 520 (FIGS. 5 and 7). As an example, cover 810 can be a solid lid or cap to provide protection to at least electronic chip 710. In one embodiment, cover 810 can be form an air tight seal with mold compound 510. As a particular example, cover 810 can be comprised of metal or plastic.

In the illustrated embodiment, cover 810 can comprise an aperture 820, optionally located within a fitting 830. Aperture 820 can expose electronic chip 710 to ambient conditions, as is required for some types of electronic chips such as, for example, at least some of the sensors described above. Fitting 830 may provide a contact point for a tube, hose, or the like that may be attached to sensing, control, or other equipment.

Alternatively, cover 810 can be comprised of a gel-type material or other compound in conjunction with a lid, wherein the gel-type material is disposed in cavity 520 around electronic chip 710 and the lid overlies cavity 520. Cover 810 can also consist solely of the gel-type material. As another example, cover 810 can comprise a membrane to provide environmental protection to the wire bonds or other bonding materials used to electrically connect electronic chip 710 to non-leaded lead frame 100.

Figure 9:
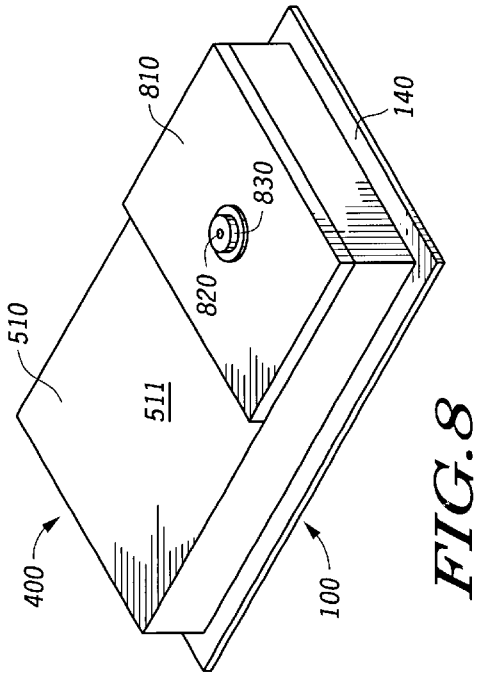
FIG. 9 is a bottom isometric view of the semiconductor component of FIG. 8 according to an embodiment of the invention.

FIG. 9 is a bottom isometric view of a semiconductor component 900 according to an embodiment of the invention. Semiconductor component 900 comprises a non-leaded lead frame 901 comprising interior electrical contracts 110, exterior electrical contracts 120, and dam bar 140. Interior electrical contacts 110 and exterior electrical contacts 120 of semiconductor component 900 comprise a notch or half etch feature obscured by a region 910 of lower surface 610 of mold compound 510. Mold compound 510 may be disposed around interior electrical contacts 110 and exterior electrical contacts 120 such that mold compound 510 at least partially fills the notches in interior electrical contacts 110 and exterior electrical contacts 120, as illustrated in FIG. 9. The notches in interior electrical contacts 110 and exterior electrical contacts 120 may serve as mold lock features, meaning that the notches may provide a place for mold compound 510 to adhere.

The notches in interior electrical contacts 10 and exterior electrical contacts 120 represent areas from which the copper or other material of non-leaded leadframe 100 has been removed, leaving regions of reduced leadframe thickness. As an example, the copper or other material can be removed by an etching process. The notches in interior electrical contacts 110 and exterior electrical contacts 120 may ease the removal of dam bar 140. For example, mold compound 510 is softer than the copper or other material of non-leaded leadframe 100, and is therefore easier for a saw or other cutting tool to cut through, resulting in less damage to the cutting tool. The notches in interior electrical contacts 110 and exterior electrical contacts 120, therefore, reduce the time and expense associated with the removal of dam bar 140.

Figure 10:
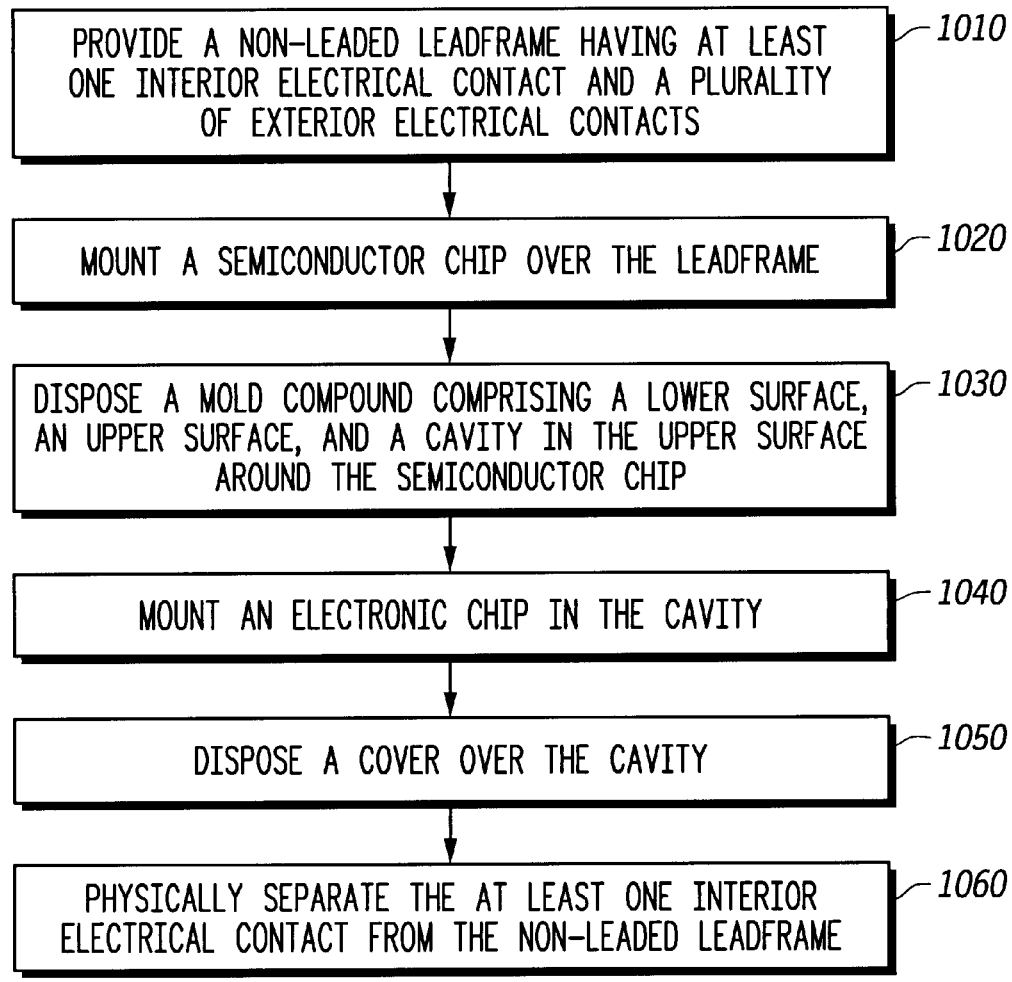
FIG. 10 is a flow chart illustrating a method of manufacturing a semiconductor component according to an embodiment of the invention.

FIG. 10 is a flow chart illustrating a method 1000 of manufacturing a semiconductor component according to an embodiment of the invention. A step 1010 of method 1000 is to provide a non-leaded leadframe having at least one interior electrical contact and a plurality of exterior electrical contacts. As an example, the non-leaded leadframe can be similar to non-leaded leadframes 100, 200, 300, and/or 901 in FIGS. 1, 2, 3, and 9, respectively.

A step 1020 of method 1000 is to mount a semiconductor chip over the leadframe. As an example, the semiconductor chip can be similar to semiconductor chip 410 in FIG. 4. Step 1020 or another step can comprise electrically coupling the semiconductor chip to the at least one interior electrical contact and to the plurality of exterior electrical contacts.

A step 1030 of method 1000 is to dispose a mold compound comprising a lower surface, an upper surface, and a cavity in the upper surface around the semiconductor chip. As an example, the mold compound can be similar to mold compound 510 in FIGS. 5–9. In one embodiment, disposing the mold compound around the semiconductor chip comprises providing a vent in the lower surface of the mold compound underneath the cavity to allow exposure to ambient conditions as discussed above. As an example, the vent can be similar to vent 620 in FIG. 6.

A step 1040 of method 1000 is to mount an electronic chip in the cavity. As an example, the electronic chip can be similar to electronic chip 710 in FIG. 7. Step 1040 or another step can comprise electrically coupling the electronic chip to the portion of the at least one interior electrical contact and to the plurality of exterior electrical contacts. The electrical coupling step can be performed before or after disposing the mold compound in step 1030. Step 1040 or another step can further comprise disposing a second compound in the cavity around the electronic chip after electrically coupling the electronic chip to the portion of the at least one interior electrical contact and t6 the plurality of exterior electrical contacts. As an example, the second compound can be similar to mold compound 510 in FIGS. 5–9, or the second compound can be similar to the gel-type material described in connection with FIG. 8.

Step 1040 or another step can still further comprise mounting one or more additional electronic chips to the leadframe. As an example, the one or more additional electronic chips can be similar to electronic chip 710 in FIG. 7 or to semiconductor chip 410 in FIG. 4. The one or more additional electronic chips can be electrically coupled to the semiconductor chip and/or to the non-leaded leadframe via wire bonds or via another electrical coupling technique. The mold compound disposed around the semiconductor chip, or another mold compound, can be disposed over or around the one or more additional electronic chips. In one embodiment, the other mold compound can be a gel-type material like that described in connection with FIG. 8.

A step 1050 of method 1000 is to dispose a cover over the cavity. As an example, the cover can be similar to cover 810 in FIG. 8. In one embodiment, step 1050 or another step can comprise providing an aperture in the cover to communicate between a location in the cavity and a location exterior to the cavity and outside of the cover, such that the electronic chip in the cavity is exposed to an ambient condition.

A step 1060 of method 1000 is to physically separate the at least one interior electrical contact from the non-leaded leadframe. In one embodiment, the at least one interior electrical contact can be physically separated from the non-leaded leadframe in a sawing or other cutting process.

Although the invention has been described with reference to specific embodiments, it will be understood by those skilled in the art that various changes may be made without departing from the spirit or scope of the invention. Various examples of such changes have been given in the foregoing description. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the semiconductor component discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A semiconductor component comprising:
   a non-leaded leadframe having at least one interior electrical contact and a plurality of exterior electrical contacts;
   a semiconductor chip mounted over the non-leaded leadframe;
   a first compound disposed around the semiconductor chip, the first compound comprising a lower surface, an upper surface, and a cavity in the upper surface exposing a portion of the at least one interior electrical contact;
   an electronic chip mounted in the cavity; and
   a cover disposed over the cavity.

2. The semiconductor component of claim 1 wherein:
   the semiconductor chip is electrically coupled to the at least one interior electrical contact; and
   the electronic chip is electrically coupled to the portion of the at least one interior electrical contact.

3. The semiconductor component of claim 1 wherein:
   the electronic chip comprises a sensor.

4. The semiconductor component of claim 3 wherein:
   the cover over the cavity comprises an aperture.

5. The semiconductor component of claim 1 further comprising:
   a second compound disposed in the cavity around the electronic chip.

6. The semiconductor component of claim 1 further comprising:
   a vent in the lower surface of the first compound underneath the cavity.

7. The semiconductor component of claim 1 wherein:
   the cover comprises a membrane.

8. The semiconductor component of claim 1 further comprising:
   a notch in the at least one interior electrical contact, wherein:
      the first compound is disposed around the at least one interior electrical contact such that the first compound at least partially fills the notch.

9. The semiconductor component of claim 1 further comprising:
   a second electronic chip mounted to the non-leaded leadframe, wherein:
      the second electronic chip is electrically coupled to the non-leaded leadframe.

10. The semiconductor component of claim 9 further comprising:
    a second compound over the second electronic chip.

11. A semiconductor component comprising:
    a quad flat non-leaded leadframe having at least one interior electrical contact and a plurality of exterior electrical contacts;
    a semiconductor chip mounted over the quad flat non-leaded leadframe;
    a first compound disposed around the semiconductor chip, the first compound comprising a lower surface, an upper surface, and a cavity in the upper surface exposing a portion of the at least one interior electrical contact, and a vent in the lower surface underneath the cavity, the plurality of exterior electrical contacts extending through the lower surface of the first compound;
    a sensor mounted in the cavity; and
    a cover disposed over the cavity.

12. The semiconductor component of claim 11 wherein:
    the semiconductor chip is electrically coupled to the at least one interior electrical contact and to at least a first one of the plurality of exterior electrical contacts; and
    the sensor is electrically coupled to the portion of the at least one interior electrical contact and to at least a second one of the plurality of exterior electrical contacts.

13. The semiconductor component of claim 11 wherein:
    the cover over the cavity comprises an aperture.

14. The semiconductor component of claim 13 wherein:
    the cover comprises a membrane.

15. The semiconductor component of claim 11 further comprising:
    a second compound disposed in the cavity around the sensor.

16. The semiconductor component of claim 11 further comprising:

a notch in the at least one interior electrical contact, wherein:
the first compound is disposed around the at least one interior electrical contact such that the first compound at least partially fills the notch.

17. The semiconductor component of claim 16 further comprising:
a second electronic chip mounted to the quad flat non-leaded leadframe, wherein:
the second electronic chip is electrically coupled to the quad flat non-leaded leadframe.

18. The semiconductor component of claim 17 further comprising:
a second compound over the second electronic chip.

19. A method of manufacturing a semiconductor component, the method comprising:
providing a non-leaded leadframe having at least one interior electrical contact and a plurality of exterior electrical contacts;
mounting a semiconductor chip over the non-leaded leadframe;
disposing a first compound around the semiconductor chip, the first compound comprising a lower surface, an upper surface, and a cavity in the upper surface exposing a portion of the at least one interior electrical contact;
mounting an electronic chip in the cavity;
disposing a cover over the cavity; and
separating the at least one interior electrical contact from the non-leaded leadframe.

20. The method of claim 19 further comprising:
electrically coupling the semiconductor chip to the at least one interior electrical contact before disposing the first compound.

21. The method of claim 19 further comprising:
electrically coupling the electronic chip to the portion of the at least one interior electrical contact after disposing the first compound.

22. The method of claim 19 wherein:
the electronic chip comprises a sensor.

23. The method of claim 22 wherein:
disposing the cover over the cavity further comprises:
providing an aperture in the cover.

24. The method of claim 19 further comprising:
disposing a second compound in the cavity around the electronic chip.

25. The method of claim 19 wherein:
disposing the first compound around the semiconductor chip comprises:
providing a vent in the lower surface of the first compound underneath the cavity.

26. The method of claim 19 wherein:
the cover comprises a membrane.

27. The method of claim 19 wherein:
providing the non-leaded leadframe comprises:
providing a notch in the at least one interior electrical contract; and
separating the at least one interior electrical contact from the non-leaded leadframe comprises:
passing a cutting tool through the notch.

28. The method of claim 19 further comprising:
mounting a second electronic chip over the non-leaded leadframe; and
electrically coupling the second electronic chip to the non-leaded leadframe.

29. The method of claim 28 further comprising:
disposing a second compound over the second electronic chip.

* * * * *